United States Patent [19]
Zinsser

[11] 4,085,384
[45] Apr. 18, 1978

[54] CIRCUIT FOR PRODUCING PULSES BY DIFFERENTIATING OUTPUT OF SAWTOOTH OSCILLATOR

[75] Inventor: Rudolf G. Zinsser, Idar-Oberstein, Germany

[73] Assignee: Reuter Technologie GmbH, Am Rauhen Berge, Germany

[21] Appl. No.: 789,579

[22] Filed: Apr. 21, 1977

[51] Int. Cl.$^2$ .......................... H03B 5/10; H03K 5/01; H03K 6/06
[52] U.S. Cl. ........................................ 331/74; 328/28; 328/34; 328/59; 331/168
[58] Field of Search .................... 331/74–77, 331/117 R, 167–171; 328/59, 60, 28, 66–68, 34, 36; 307/261

[56] References Cited
U.S. PATENT DOCUMENTS 2,461,321  2/1949  Guillemin ..................... 328/59 X
3,508,157  4/1970  Mobley ........................ 328/66 X

*Primary Examiner*—Siegfried H. Grimm
*Attorney, Agent, or Firm*—McGlew and Tuttle

[57] ABSTRACT

The generator produces a pulse train with a given pulse duty factor and a relatively small pulse width, and comprises an oscillator including a resonance circuit having multiple frequencies and tuned to the fundamental frequency corresponding to the pulse repetition rate and to at least the first and second harmonics of the fundamental frequency. On the output side, there is generated a sawtooth wave with a steep leading edge having an inflexion point. Differentiation members couple the resonance circuit to a load so that, as a result of matched differentiation of the steep leading edge of each sawtooth of the wave, a pulse, having a pulse width corresponding approximately to the pulse time of the leading edge, acts on the load.

10 Claims, 3 Drawing Figures

CIRCUIT FOR PRODUCING PULSES BY DIFFERENTIATING OUTPUT OF SAWTOOTH OSCILLATOR

FIELD AND BACKGROUND OF THE INVENTION

The invention relates to a pulse generator for producing a pulse train with a given pulse duty factor and a relatively small pulse width.

Pulse generators for producing pulse trains are known in manifold designs. In pulse generators of this type, the steepness of the pulses is determined by the upper limiting frequency of the active elements. When the upper limiting frequency is reached, the amplification becomes smaller than 1 so that the oscillator in the pulse generator ceases to oscillate when the limiting frequency is exceeded. For the manufacture of pulse generators with very short pulses and very steep edges, it is therefore necessary to provide active elements which have an upper limiting frequency which is above the component frequencies determining the steep edges. The development and the manufacture of active elements of this type for high frequencies in the megahertz or gigahertz range are very involved and cost-intensive. It is thus desirable to provide a pulse generator which can be operated with active elements, the upper limiting frequency of which is very much lower than the highest component frequencies determining the steep edges. It is immaterial here whether thermionic tubes or semiconductor devices are used as the active elements in the oscillator part of the pulse generator.

SUMMARY OF THE INVENTION

According to the invention, this object is achieved by an oscillator comprising a resonant circuit which has multiple resonances and which is tuned to the fundamental frequency of the oscillator and to at least the first and second harmonics and, if appropriate, to higher harmonics in such a way that, on the output side, a saw-tooth wave is generated, each steep leading edge of which has an inflexion point, and by coupling the resonant circuit via differentiation members to a load in such a way that, as a result of appropriate differentiation of the steep leading edge of the particular saw-tooth, a pulse with a pulse width corresponding approximately to the pulse time of the leading edge acts on the load.

A development of the invention provides that the amplitude of the highest harmonic, determing the pulse width, is substantially smaller, and preferably about ¼ or 1/6 and less, than the amplitude of the fundamental frequency determining the pulse repetition rate, and that the intermediate lower harmonics have an amplitude which is smaller than that of the fundamental frequency and which also decreases to the value of the highest harmonic as the ordinal number of the harmonic increases. However, it is also provided that the amplitude of the higher harmonic, determining the pulse width, is substantially smaller, and preferably about ¼ or 1/6 and less, than the amplitude of the fundamental frequency determining the pulse repetition rate, and that the lower intermediate harmonics have an amplitude which is equal to the amplitude of the highest harmonics.

It is already known that a saw-tooth wave with a linear rise can be resolved into an infinite series of sinusoidal waves. For the present invention, however, only a limited smaller number of harmonics is necessary, the particular highest harmonic together with the fundamental frequency determining the pulse duty factor of the pulse train. The amplitudes of the fundamental frequency and of the individual harmonics can be in a mutual relationship, such as can be derived for the corresponding component waves by a Fourier analysis of a saw-tooth. However, it is by no means necessary that these amplitude relationships apply. Rather, a multiplicity of alternative amplitude relationships can be used and it has been found that it is sufficient for optimum operation if the amplitudes of the harmonics each are ¼ and less than the amplitude of the fundamental frequency. Neither is it necessary that all the harmonics between the fundamental frequency and the highest harmonic are utilized, as will be explained in more detail in the following text.

The pulse generator according to the invention has the advantage that it enables a pulse train of very short and steep as well as powerful pulses to be generated at a relatively high pulse repetition rate. For the pulse generator, it is thus possible to use powerful active elements which have a relatively low upper limiting frequency and which hence ensure reliable operation of the pulse generator. It is a further advantage of the pulse generator that the pulse amplitude and hence the power are mainly derived from the fundamental frequency, while the harmonic oscillations in the main only contribute to the steepness of the pulse edges, the highest harmonic determining the pulse width and hence, in cooperation with the fundamental frequency, the pulse duty factor.

According to a further development of the invention, it is also provided that the oscillator circuit is connected to a supply voltage via band stop filters which are connected in series and which have a high transfer resistance for the base frequency and for the particular frequencies of the harmonics. In this way, the draining of energy, associated with individual frequencies, from the multiple resonant circuit is avoided, and this is important for optimizing the operation of the pulse generator.

BRIEF DESCRIPTION OF THE DRAWING

The features and advantages of the invention can also be seen from the description which follows of illustrative embodiments, in conjunction with the claims and the drawing in which:

DESCRIPTION OF THE PREFERRED EMBODIMENTS

Figure 1:
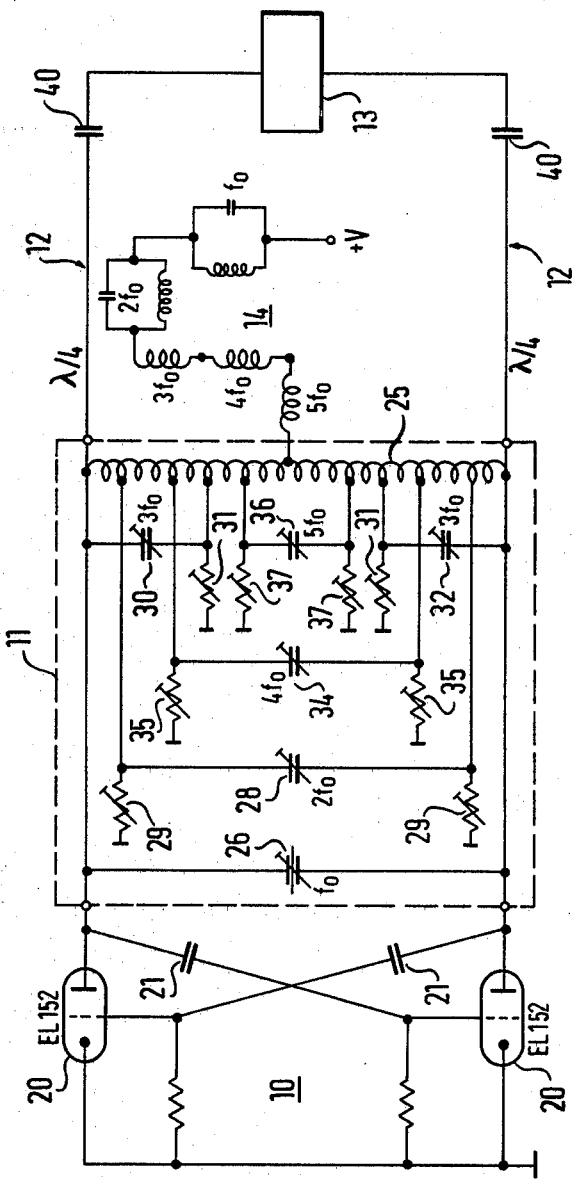
FIG. 1 is a circuit diagram of a pulse generator according to the invention in a diagrammatical representation.

FIG. 1 shows the circuit diagram of a pulse generator which consists of a push-pull oscillator 10 with a multiple resonant circuit 11 and a circuit 12 which couples it to a load 13. The oscillator part of the pulse generator is connected to the supply voltage +V via a chain 14 of filters.

With the exception of the multiple resonant circuit 11, the oscillator circuit is constructed in the conventional manner as a push-pull oscillator, the illustrative embodiment described operating with two thermionic tubes 20 which feed back crosswise from the anode to the grid via coupling capacitors 21 in such a way that the tubes are operating with high gain. This part of the oscillator circuit can be built up in any desired manner as long as, in cooperation with the multiple resonant circuit 11, it results in an oscillator circuit. The active elements used here will be those which have an upper limiting frequency above the frequency of the fundamental. In the type EL 152 tubes used in the illustrative embodiment, the upper limiting frequency is about 120 MHz, whilst the pulse repetition rate generated by the pulse generator is about 45 MHz, the fifth and higher harmonics being utilized depending on the design of the multiple resonant circuit 11. It is also not necessary that the active elements consist of tubes. Rather, semi-conductor elements can also be used in their place.

The multiple resonant circuit 11 of the oscillator circuit is built up in such a way that it consists of a multiplicity of resonant circuits, each of which is tuned to particular frequencies. These are the fundamental frequency which determines the pulse repetition rate and the harmonics associated with this fundamental frequency.

In FIG. 1, the multiple resonant circuit is built up symmetrically and comprises an inductance 25 to which a capacitor 26 is connected in parallel. These two elements are tuned to the fundamental frequency $f_o$. A secondary resonant circuit which is tuned to the second harmonic $2f_o$ comprises a part of the inductance 25 and a capacitor 28. Attenuators 29 are connected to this secondary resonant circuit in order to adjust the amplitude of the second harmonic to a value which is smaller than the amplitude of the fundamental frequency.

The secondary resonant circuit for the third harmonic $3f_o$ is sub-divided and comprises the capacitors 30 and 32, each of which is connected in parallel to a respective end section of the inductance 25. This secondary resonant circuit is also attenuated with the aid of attenuators 31 in order to adjust the amplitude to a value which is smaller than that of the fundamental frequency.

The secondary resonant circuits for the fourth and fifth harmonics $4f_o$ and $5f_o$ comprise a capacitor 34 or a capacitor 36, respectively, which are connected in parallel to a respective section, corresponding to the harmonic, of the inductance 25. These secondary resonant circuits are also connected to attenuators 35 or 37 respectively. The individual attenuators of the secondary resonant circuits can be designed in the customary manner and can consist, for example, of adjustable ohmic resistances which are connected in the customary manner to the associated secondary resonant circuit.

The ratio of the amplitude of the harmonics, the magnitude of which has been adjusted by the attenuators, to the amplitude of the fundamental frequency does not have to follow any particular set pattern. However, since the fundamental frequency in the main determines the pulse power of the pulse generator and the harmonics in the main only have an influence on the shape of the pulse, that is to say the steepness of the edge, the fundamental frequency must have the largest possible amplitude value, whilst it suffices if the harmonics have an amplitude of $\frac{1}{4}$ and less. In an actual circuit, good results could be obtained using the following functional relationship:

$A(f_o)$; $A/4(2f_o)$; $A/4(3f_o)$; $A/4(4f_o)$; $A/4(5f_o)$

Other amplitude ratios, with the amplitude decreasing as the order of the harmonics increases, have also given satisfactory results.

As already mentioned, the amplitude of the harmonics primarily affects the steepness of the edge and in particular the trailing edge of the pulse. The steepness of the latter is completely independent of the limiting frequency or the characteristic properties of the active element.

The pulse duty factor of the pulse train is determined by the highest harmonic which is used, since the latter determines the pulse width, as will be explained in more detail later by reference to FIG. 3.

According to FIG. 1, the oscillator circuit is connected to the load 13 via the coupling circuit 12. This coupling circuit consists in each case of a quarter-wave line which is connected to the decoupling taps of the inductance 25 and joins the differentiation capacitors 40 to the multiple resonant circuit 11. These differentiation capacitors are of an order of magnitude of about 1 to 5 pF when the pulse repetition rates are of an order of magnitude of about 45 MHz and at least the fifth harmonic is used.

The saw-tooth potential applied via the quarter-wave lines is differentiated by these differentiation capacitors 40 so that the pulses derived from the saw-tooth by the differentiation come to act on the load 13. For optimum operation it is advantageous if there is matching between the multiple resonant circuit 11 and the load 13, but satisfactory pulses can still be produced even in the case of mismatching.

Figure 2:
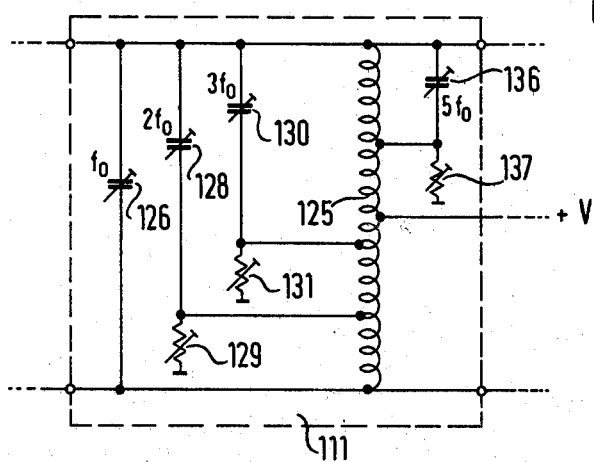
FIG. 2 is a circuit diagram of a further embodiment of the multiple resonance circuit, such as can be used in the circuit according to FIG. 1.

FIG. 2 shows a further embodiment of a multiple resonant circuit 111 which can be used in place of the multiple circuit 11 in the circuit according to FIG. 1. This multiple resonant circuit 111 is built up asymmetrically and differs from the embodiment according to FIG. 1 in that the secondary resonant circuit tuned to the harmonic $4f_o$ is lacking. This results in a saw-tooth wave which has a somewhat modified shape but from which the same pulse repetition rate and the same pulse duty factor as in the embodiment according to FIG. 1 are derived if the same frequency of the fundamental is used. The elements corresponding to the build-up of the multiple resonant circuit 111 are characterized in FIG. 2 by corresponding reference numerals augmented by the value 100.

For satisfactory operation of the pulse generator, it is also necessary, in the embodiment according to FIG. 2, that the amplitudes of the harmonics are reduced relative to the fundamental frequency. The same amplitude relationships as mentioned in connection with FIG. 1 can be used. In an actual circuit build-up, the following amplitude relationship was provided and used very successfully:

$A(f_o)$; $A/\sqrt{2}(2f_o)$; $A/2 (3f_o)$; $A/4 (5f_o)$

Of course, satisfactory results are also obtained with many other relationships which differ from the amplitude relationship indicated, since, as already mentioned, the harmonics make only a minor contribution to the total power of the generated pulse train, the energy of which is in the main derived from the fundamental frequency.

The asymmetrical build-up of the multiple resonant circuit 111 according to FIG. 2 has an advantage because the spacially different couplings of the capacitors, associated with the individual secondary resonant circuits, to the inductance 125 facilitate the adjustment of the relative phase position of the secondary oscillations and hence facilitate the tuning of the multiple resonant circuit. The most favorable conditions are established when the relative phase angle of the individual secondary oscillations is 0.

In such a pulse generator, built up in accordance with the examples illustrated, pulses with a peak-to-peak amplitude of 400 V could be generated using type EL 152 tubes, the frequency of the fundamental being about 45 MHz. As will be explained in more detail in the following text, the pulse duration is derived from half the period of the highest harmonic. However, pulses with peak-to-peak amplitudes between 600 V and 800 V and a pulse width of 2.5 nanoseconds are also possible using the same tubes. At lower powers, it is also possible to generate pulses with a pulse width of about 0.5 nanoseconds.

Figure 3:
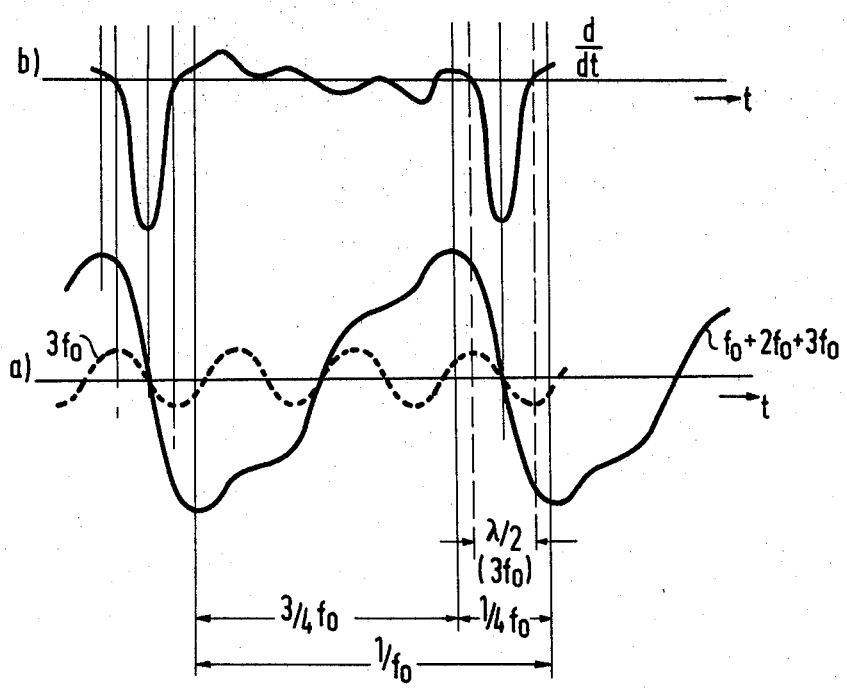
FIG. 3 is a graphical representation of a saw-tooth wave and the pulses derived therefrom, in order to illustrate the mode of action of the invention.

In order to explain the pulse generator circuit, reference is made to FIG. 3 which, in part a), shows a sawtooth oscillation which is built up from a base oscillation with the frequency $f_o$ and also the second harmonic with the frequency $2f_o$ and the third harmonic with the frequency $3f_o$. On top of the time axis, the third harmonic $3f_o$ is drawn in dotted lines with the relative phase position 0. This representation clearly shows that the superposition of the second and third harmonics on to the fundamental frequency already leads to a saw-tooth wave which has a leading edge with markedly steeper and markedly flatter slopes. In the region of the steep leading edge, the saw-tooth wave has an inflexion point which preferably lies approximately in the middle of the steep leading edge. By differentiating this saw-tooth oscillation with the aid of the differentiation capacitor 40 according to FIG. 1, a curve of potential is obtained, such as can be seen from the diagram b), which makes it possible to see that the differentiation of the steeper leading edge with the inflexion point produces a pulse, the pulse duration of which depends on half the period of the highest harmonic $3f_o$ used. In building up the saw-tooth wave from a fundamental frequency and higher harmonics, the steepness of the steep edge can be further increased and the pulse duration can thus be further reduced, the pulse duration resulting, as mentioned, from half the period of the highest harmonic (for consistency).

If, as compared with the mode of representation according to FIG. 1, a modified build-up of the multiple resonant circuit is used, either by omitting the secondary resonant circuit with the fourth harmonic or by adding further secondary resonant circuits with higher harmonics, the chain 14 of band stop filters must be adapted correspondingly and, in the band stop filters connected in series, a band stop filter tuned to the missing harmonic (consistency) must be omitted or, respectively, when further secondary resonant circuits are added, band stop filters must be added which are tuned to the frequency of the corresponding harmonics.

In the preceding text, a pulse generator has been described which, with different types of build-up, is suitable for generating pulses of very short duration at a relatively high repetition rate, it being possible for the uppermost limiting frequency of the active elements in the oscillator circuit to be substantially lower than the component frequencies corresponding to the steepness of the edge of the pulses. By an appropriate design of the multiple resonant circuits it is possible to vary the pulse duty factor for a given pulse repetition rate and to create pulses with a very small pulse width. The pulse generator according to the invention is very stable with respect to the pulse repetition rate and to the set pulse duty factor and, in the case of a sufficiently high power of the fundamental frequency, also yields powerful pulses.

What we claim is:

1. A pulse generator comprising, in combination, an oscillator including a resonance circuit having multiple frequencies and tuned to the fundamental frequency corresponding the the pulse repetition rate and to at least the first and second harmonics of the fundamental frequency to generate, on its output side, a sawtooth wave with a steep leading edge having an inflexion point; and differentiation members coupling said resonance circuit to a load so that, as a result of matched differentiation of the steep leading edge of each sawtooth of the wave, a pulse, having a pulse width corresponding approximately to the pulse time of the leading edge, acts on the load.

2. Pulse generator as claimed in claim 1, wherein the amplitude of the highest harmonic, determining the pulse width, is substantially smaller than the amplitude of the fundamental frequency determining the pulse repetition rate, and the lower intermediate harmonics have an amplitude which is smaller than that of the fundamental frequency and which also decreases to the value of the highest harmonic as the ordinal number of the harmonics increases.

3. Pulse generator, as claimed in claim 2, wherein the amplitude of the highest harmonic is about one quarter the amplitude of the fundamental frequency.

4. Pulse generator, as claimed in claim 2, wherein the amplitude of the highest harmonic is about one sixth the amplitude of the fundamental frequency.

5. Pulse generator, as claimed in claim 2, wherein the amplitude of the highest harmonic is less than one sixth the amplitude of the fundamental frequency.

6. Pulse generator as claimed in claim 1, wherein the amplitude of the highest harmonic, determining the pulse width, is substantially smaller, than the amplitude of the fundamental frequency determining the pulse repetition rate, and the lower intermediate harmonics have an amplitude which is equal to the amplitude of the highest harmonic.

7. Pulse generator, as claimed in claim 6 wherein the amplitude of the highest harmonic is about ¼ the amplitude of the fundamental frequency.

8. Pulse generator, as claimed in claim 1, wherein the amplitude of the highest harmonic is about 1/6 the amplitude of the fundamental frequency.

9. Pulse generator, as claimed in claim 6, wherein the amplitude of the highest harmonic is less than 1/6 the amplitude of the fundamental frequency.

10. Pulse generator, as claimed in claim 1, including band stop filters connecting said resonance circuit to a supply voltage; said band stop filters being connected in series and having a high transfer resistance for the fundamental frequency and for the particular frequencies of the harmonics.

* * * * *